US012152298B2

(12) United States Patent
Komori

(10) Patent No.: US 12,152,298 B2
(45) Date of Patent: Nov. 26, 2024

(54) POWDER CONVEYING APPARATUS, GAS SUPPLY APPARATUS, AND METHOD FOR REMOVING POWDER

(71) Applicant: Tokyo Electron Limited, Tokyo (JP)

(72) Inventor: Eiichi Komori, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/245,618

(22) PCT Filed: Sep. 21, 2021

(86) PCT No.: PCT/JP2021/034619
§ 371 (c)(1),
(2) Date: Mar. 16, 2023

(87) PCT Pub. No.: WO2022/071030
PCT Pub. Date: Apr. 7, 2022

(65) Prior Publication Data
US 2023/0332285 A1    Oct. 19, 2023

(30) Foreign Application Priority Data

Sep. 29, 2020   (JP) ................. 2020-163475

(51) Int. Cl.
C23C 16/448   (2006.01)
C23C 14/24    (2006.01)
C23C 14/54    (2006.01)

(52) U.S. Cl.
CPC ............ C23C 14/54 (2013.01); C23C 14/246 (2013.01)

(58) Field of Classification Search
CPC .............. C23C 16/45561; C23C 16/52; C23C 16/4481; C23C 16/448
See application file for complete search history.

(56) References Cited

U.S. PATENT DOCUMENTS 4,613,259 A  *  9/1986  Packer ................. B05B 7/1404
                                                    406/14
2006/0086319 A1* 4/2006  Kasai ............... C23C 16/45565
                                                    156/345.33

(Continued)

FOREIGN PATENT DOCUMENTS

JP   2002-208564    7/2002
JP   2008-251905    10/2008
JP   2016-089885    5/2016

OTHER PUBLICATIONS

U.S. Appl. No. 17/648,337, filed Jan. 19, 2022, US20220243321A, Tokyo Electron Limited.

Primary Examiner — Joseph A Miller, Jr.
(74) Attorney, Agent, or Firm — IPUSA, PLLC

(57) ABSTRACT

A powder conveying apparatus, a gas supply apparatus, and a method for removing powder that suppresses internal leakage are provided.

A powder conveying apparatus includes a powder transport line via which a powder feedstock source is coupled to a vaporizer, and includes a first valve provided on a powder feedstock source-side of the powder transport line. The powder conveying apparatus includes a second valve provided on a vaporizer-side of the powder transport line, and includes a buffer tank configured to be filled with a purge gas. The powder conveying apparatus includes a first purge-gas supply line coupled to the powder transport line upstream of the second valve, the first purge-gas supply line enabling the purge gas to be supplied from the buffer tank to the second valve. The powder conveying apparatus includes a first purge gas valve provided on the first purge-gas supply line. The powder conveying apparatus includes a controller configured to control opening and closing of the first valve, the second valve, and the first purge gas valve.

11 Claims, 12 Drawing Sheets

(56) References Cited

U.S. PATENT DOCUMENTS

| | | | |
|---|---|---|---|
| 2006/0141782 A1* | 6/2006 | Hasebe | C23C 16/52 438/680 |
| 2007/0056509 A1* | 3/2007 | Barbezat | B05B 7/1404 118/308 |
| 2009/0145358 A1* | 6/2009 | Lee | C23C 14/12 222/630 |
| 2010/0136230 A1 | 6/2010 | Moriya et al. | |

* cited by examiner

POWDER CONVEYING APPARATUS, GAS SUPPLY APPARATUS, AND METHOD FOR REMOVING POWDER

TECHNICAL FIELD

The present disclosure relates to a powder conveying apparatus, a gas supply apparatus, and a method for removing powder.

BACKGROUND

Substrate processing systems are known in which source gases are supplied to film deposition apparatues by vaporizing solid sources.

Patent Document 1 discloses a substrate processing system that includes a powdery source supply system and a film deposition apparatus. The powdery source supply system includes an ampoule for holding a powdery source, a carrier-gas supply apparatus for supplying a carrier gas to the ampoule, a powdery-source inlet line for connecting the ampoule and the film deposition apparatus, a purge line that branches from the powdery-source inlet line, and an on-and-off valve for opening or closing the powdery-source inlet line. Before a deposition process, when the on-and-off valve is opened to exhaust the interior of the purge line, the carrier-gas supply apparatus supplies the carrier gas such that a viscous force of the carrier gas is greater than the viscous force of the carrier gas that is used in the deposition process.

CITATION LIST

Patent Document

[Patent Document 1] Japanese Unexamined Patent Application Publication No. 2008-251905

SUMMARY

Problem to be Solved by the Invention

In one aspect, the present disclosure provides a powder conveying apparatus, a gas supply apparatus, and a method for removing powder that suppresses internal leakage.

Means for Solving the Problem

To solve the problem, in one aspect, a powder conveying apparatus is provided. The powder conveying apparatus includes a powder transport line via which a powder feedstock source is coupled to a vaporizer. The powder conveying apparatus includes a first valve provided on a powder feedstock source-side of the powder transport line. The powder conveying apparatus includes a second valve provided on a vaporizer-side of the powder transport line. The powder conveying apparatus includes a buffer tank configured to be filled with a purge gas. The powder conveying apparatus includes a first purge-gas supply line coupled to the powder transport line upstream of the second valve, the first purge-gas supply line enabling the purge gas to be supplied from the buffer tank to the second valve. The powder conveying apparatus includes a first purge gas valve provided on the first purge-gas supply line. The powder conveying apparatus includes a controller configured to control opening and closing of the first valve, the second valve, and the first purge gas valve.

Effect of the Invention

According to one aspect, a powder conveying apparatus, a gas supply apparatus, and a method for removing powder that suppress internal leakage can be provided.

DESCRIPTION OF EMBODIMENTS

Figure 1:
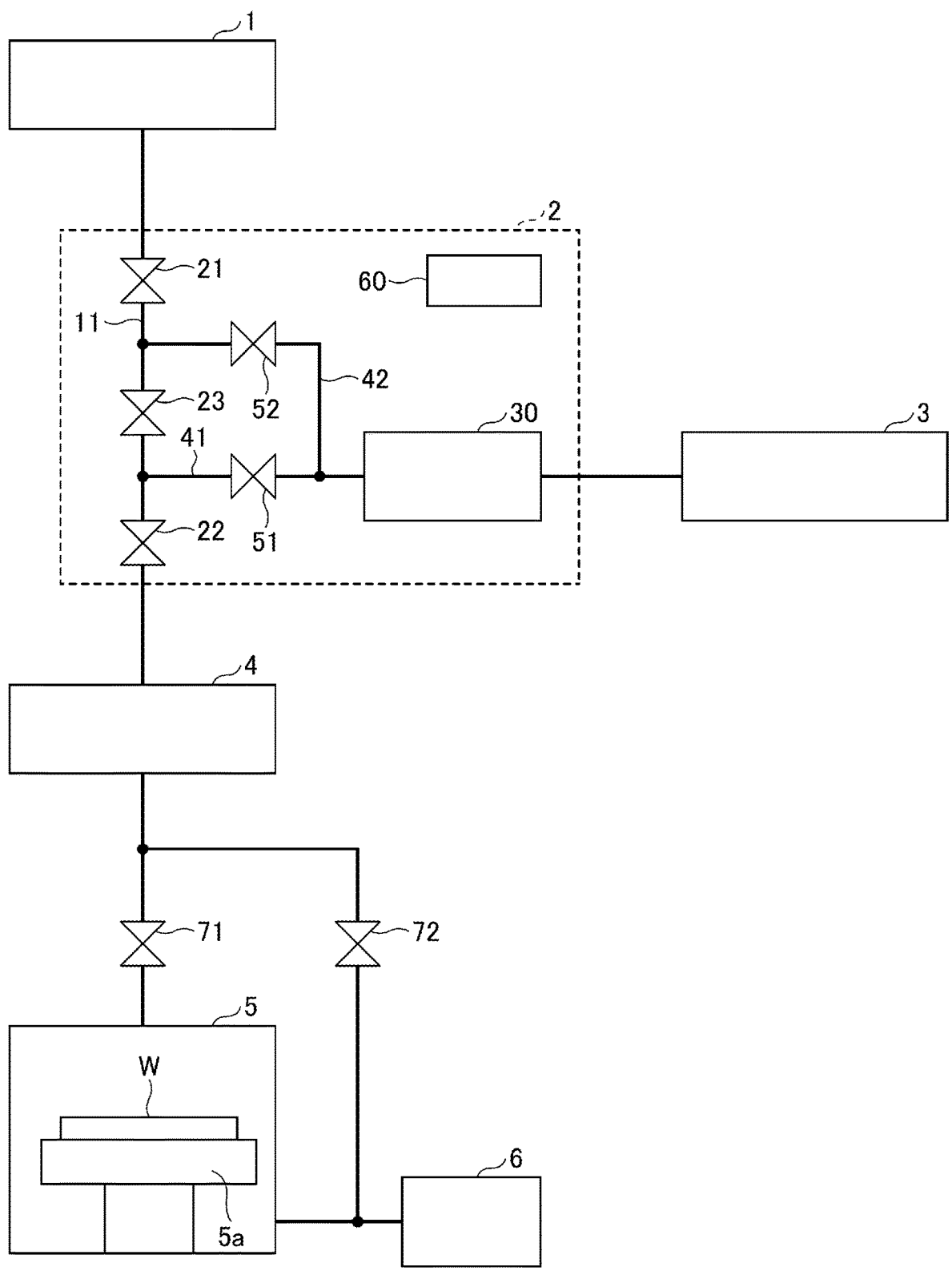
FIG. 1 is a diagram illustrating a configuration example of a substrate processing system with a powder conveying apparatus according to a first embodiment.

Embodiments of the present disclosure will be described below with reference to the drawings. In the drawings, the same components are denoted by the same reference numerals, and redundant description may be omitted.

First Embodiment

A substrate processing system with a powder conveying apparatus 2 according to the first embodiment will be described with reference to FIG. 1. FIG. 1 is a diagram illustrating a configuration example of the powder conveying apparatus 2 according to the first embodiment. The substrate processing system includes a powder feedstock source 1, the powder conveying apparatus 2, a purge gas source 3, a vaporizer 4, a processing chamber 5, and an exhaust device 6. In the substrate processing system, a powder feedstock is supplied, via the powder conveying apparatus 2, from the powder feedstock source 1 to the vaporizer 4.

Also, in the substrate processing system, the powder feedstock is vaporized at the vaporizer 4, then a vaporized source gas is supplied to the processing chamber 5, and thus a desired process (for example, a deposition process) is performed on a substrate W in the processing chamber 5. The powder feedstock source 1, the powder conveying apparatus 2, and the vaporizer 4 function as a gas supply apparatus that supplies the source gas to the processing chamber 5.

The powder feedstock source 1 stores the powder feedstock. The powder feedstock source 1 also feeds (pushes out) the powder feedstock to a powder transport line 11 of the powder conveying apparatus 2.

The powder conveying apparatus 2 includes the powder transport line 11, a first valve 21, a second valve 22, a third valve 23, a buffer tank 30, a first purge-gas supply line 41, a second purge-gas supply line 42, a first purge gas valve 51, a second purge gas valve 52, and a control device 60.

The powder transport line 11 is coupled, at one end, to the powder feedstock source 1, and the other end of the powder transport line 11 is coupled to the vaporizer 4. The powder feedstock that is fed from the powder feedstock source 1 to the powder transport line 11 is conveyed via the powder transport line 11, by gravity that acts on the powder feedstock, and then the powder feedstock is supplied to the vaporizer 4. With this arrangement, the powder transport line 11 functions as a powder-feedstock transport path via which the powder feedstock is conveyed from the powder feedstock source 1 to the vaporizer 4.

The first valve 21 and the second valve 22, each of which opens or closes a flow path of the powder transport line 11, are provided on the powder transport line 11. In other words, the first valve 21 is provided on the powder transport line 11 that is a secondary-side line of the powder feedstock source 1.

The second valve 22 is provided on the powder transport line 11 that is a primary-side line of the vaporizer 4. The first valve 21 is provided upstream (powder feedstock source 1-side) of the second valve 22. The second valve 22 is provided downstream (vaporizer 4-side) of the first valve 21.

The first valve 21 is provided on the powder transport line 11 on a side where the powder feedstock source 1 is situated, when viewed from a branch point (first branch point) at which the first purge-gas supply line 41 branches from the powder transport line 11. The second valve 22 is provided on the powder transport line 11 on a side where the vaporizer 4 is situated, when viewed from the branch point (first branch point) at which the first purge-gas supply line 41 branches from the powder transport line 11. The first valve 21 is provided on the powder transport line 11 on the side where the powder feedstock source 1, when viewed from a branch point (second branch point) at which the second purge-gas supply line 42 branches from the powder transport line 11. The second valve 22 is provided on the powder transport line 11 on the side where the vaporizer 4 is situated, when viewed from the branch point (second branch point) at which the second purge-gas supply line 42 branches from the powder transport line 11.

A third valve 23, which opens or closes a flow path of the powder transport line 11, is provided on the powder transport line 11. The third valve 23 is provided between the first valve 21 and the second valve 22. The third valve 23 is also provided between the branch point (second branch point), at which the second purge-gas supply line 42 branches from the powder transport line 11, and the branch point (first branch point) at which the first purge-gas supply line 41 branches from the powder transport line 11.

Each of the valves 21 to 23 that is disposed on the powder transport line 11 includes a valve disc (not illustrated) and a valve seat (not illustrated). Each valve disc is separated from a corresponding valve seat so that the flow path is opened, where each of the valves 21 to 23 is opened. Each valve disc comes into close contact with the corresponding valve seat so that the flow path is closed, where each of the valves 21 to 23 is closed.

The purge gas source 3 supplies a purge gas to the buffer tank 30. The purge gas is supplied from the purge gas source 3 to the buffer tank 30, and the buffer tank 30 is filled with the purge gas at a high pressure (for example, from 0.1 MPa to 0.3 MPa). As the purge gas, for example, $N_2$ gas can be used.

The first purge-gas supply line 41 is coupled, at one end, to the powder transport line 11 at the branch point (first branch point) that is situated upstream of the second valve 22 (between the third valve 23 and the second valve 22), and the other end of the first purge-gas supply line 41 is coupled to the buffer tank 30. With this arrangement, the first purge-gas supply line 41 functions as a first purge-gas supply path via which the purge gas is supplied from the buffer tank 30 to the powder transport line 11. A first purge gas valve 51, which opens or closes a flow path of the first purge-gas supply line 41, is provided on the first purge-gas supply line 41.

The second purge-gas supply line 42 is coupled, at one end, to the powder transport line 11 at the branch point (second branch point) that is situated upstream (between the first valve 21 and the third valve 23) of the third valve 23, and the other end of the second purge-gas supply line 42 is coupled to the buffer tank 30. With this arrangement, the second purge-gas supply line 42 functions as a second purge-gas supply path via which the purge gas is supplied from the buffer tank 30 to the powder transport line 11. A second purge gas valve 52, which opens or closes a flow path of the second purge-gas supply line 42, is provided on the second purge-gas supply line 42.

The control device 60 controls the opening and closing of the valves 21 to 23 and the purge gas valves 51 and 52.

The powder feedstock is supplied to the vaporizer 4 via the powder transport line 11 as a primary-side line. The vaporizer 4 includes a heating unit (not illustrated) such as a heater that heats the powder feedstock. The vaporizer 4 heats and vaporizes the powder feedstock to form a source gas. The vaporizer 4 has a filter (not illustrated) that collects the powder feedstock. With this arrangement, the powder feedstock is prevented from flowing into the processing chamber 5 via a secondary-side line of the vaporizer 4.

The secondary-side line of the vaporizer 4 is coupled to the processing chamber 5 via a valve 71. With this arrangement, the source gas is supplied from the vaporizer 4 to the processing chamber 5 by opening the valve 71, and the supply of the source gas to the processing chamber 5 is interrupted by closing the valve 71.

The secondary-side line of the vaporizer 4 is coupled to the exhaust device 6 via a valve 72. With this arrangement, the gas is moved from the vaporizer 4 into the exhaust device 6 upon opening the valve 72. The movement of the gas into the exhaust device 6 is interrupted upon closing the valve 72.

The processing chamber 5 includes a mounting portion 5a on which the substrate W is placed. An interior of the processing chamber 5 can be depressurized by the exhaust device 6. The source gas is supplied from the vaporizer 4 to the processing chamber 5, and thus a desired process is performed on the substrate W that is placed on the mounting portion 5a.

The exhaust device 6 is coupled to the processing chamber 5, and depressurizes the interior of the processing chamber 5. The exhaust device 6 is coupled to the vaporizer 4, and depressurizes the interior of the vaporizer 4.

Figure 2:
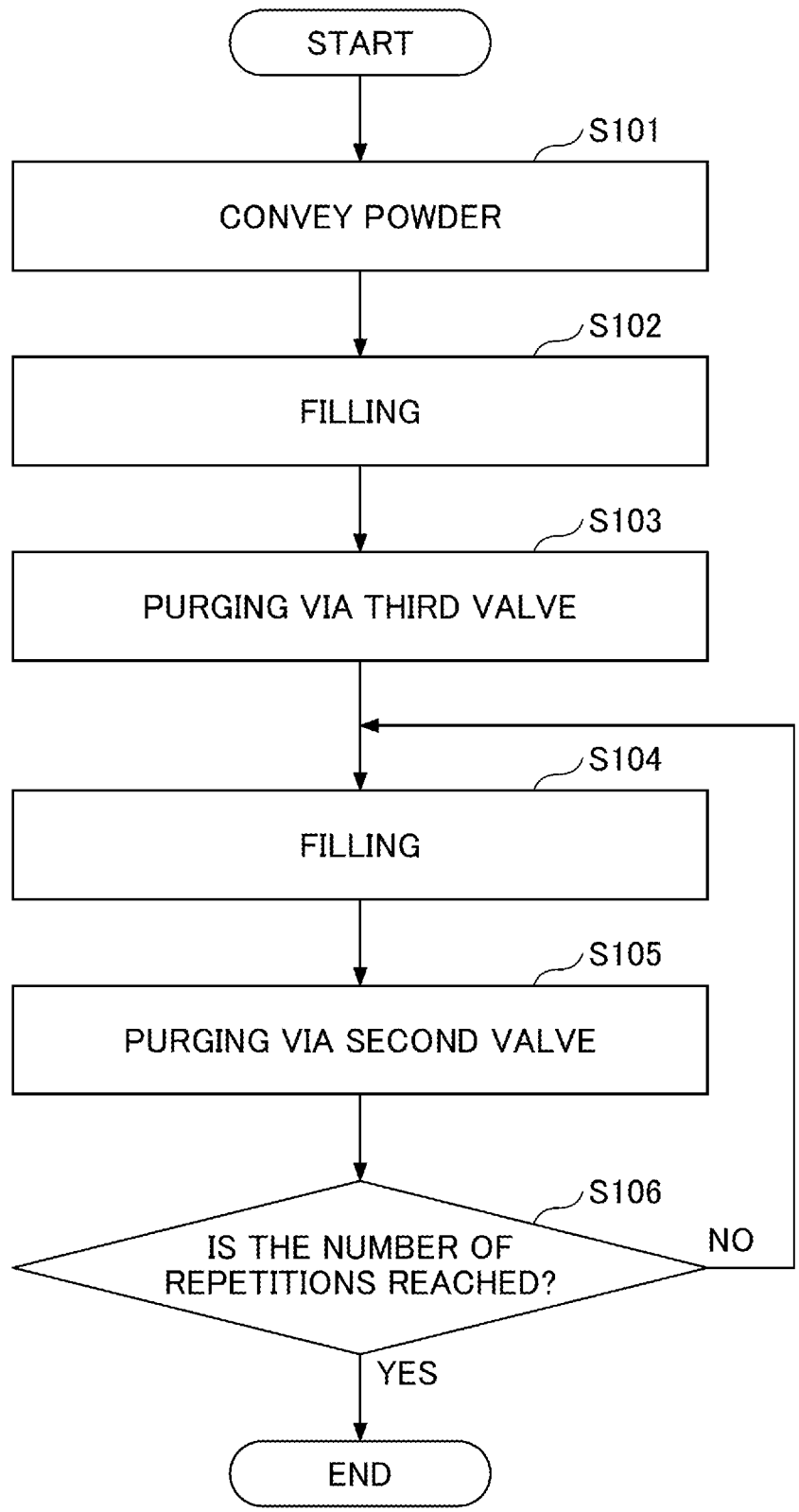
FIG. 2 is a flowchart illustrating an example of the operation of the powder conveying apparatus.

Hereinafter, an example of the operation of the powder conveying apparatus 2 will be described with reference to FIGS. 2 to 7. FIG. 2 is a flowchart illustrating an example of the operation of the powder conveying apparatus 2. FIGS. 3 to 7 are diagrams for describing the opening and closing of the valves 21 to 23, and 51 to 52 and formation of the flow path in corresponding steps. In each of FIGS. 3 to 7 (and FIGS. 10 to 12 described below), each valve in an open state is illustrated in white, and each valve in a closed state is illustrated in black. In addition, each flow path that is formed by opening and closing the valves is illustrated by a thick line.

Figure 3:
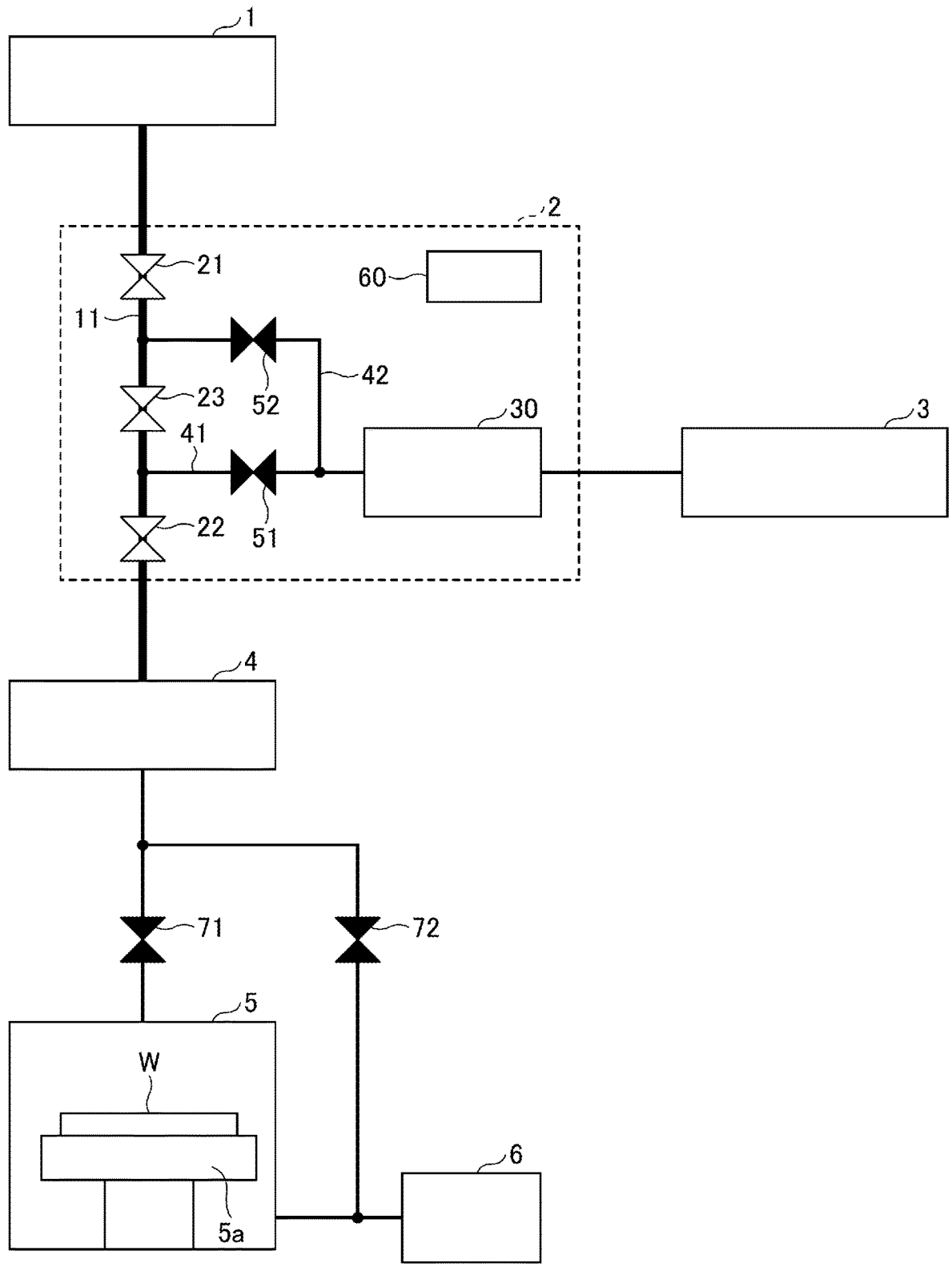
FIG. 3 is a diagram for describing the opening and closing of valves and formation of a flow path during conveyance of a powder feedstock.

In step S101, the control device 60 causes the powder feedstock to be conveyed from the powder feedstock source 1 to the vaporizer 4. FIG. 3 is a diagram for describing the opening and closing of the valves and formation of the flow path during conveyance of the powder feedstock. The control device 60 causes the first valve 21, the third valve 23, and the second valve 22 to open. The control device 60 causes the first purge gas valve 51 and the second purge gas valve 52 to open. With this arrangement, the powder transport line 11 of the powder conveying apparatus 2 causes the powder feedstock source 1 and the vaporizer 4 to be in communication with each other. The first purge-gas supply line 41 and the second purge-gas supply line 42 are closed.

The powder feedstock that is fed from the powder feedstock source 1 passes through the powder transport line 11, and finally the powder feedstock is conveyed to the vaporizer 4. At this time, a portion of the powder feedstock adheres to the inner wall surface of the powder transport line 11 and surfaces or the like of the valve discs and valve seats of the respective valves 21 to 23.

Figure 4:
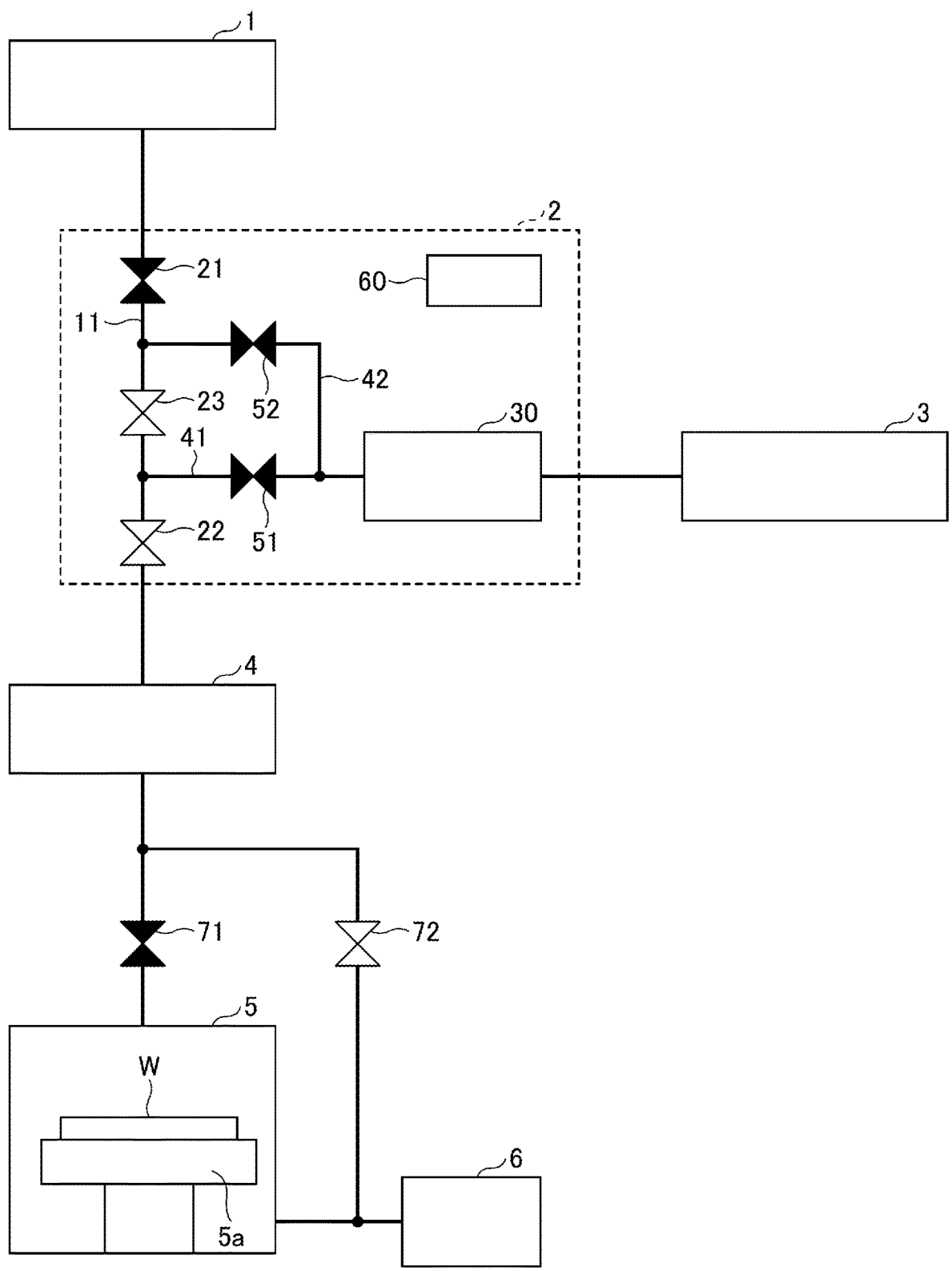
FIG. 4 is a diagram for describing the opening and closing of the valves and formation of the flow path during filling of a purge gas.

In step S102, the control device 60 causes the buffer tank 30 to be filled with the purge gas. FIG. 4 is a diagram for describing the opening and closing of the valves and formation of the flow path during filling of the purge gas. In this case, the buffer tank 30 is filled with the purge gas before a purge process illustrated in step S103 described below. The control device 60 causes the first purge gas valve 51 and the second purge gas valve 52 to close. With this arrangement, the first purge-gas supply line 41 and the second purge-gas supply line 42 are closed. As a result, the buffer tank 30 is filled with the purge gas that is supplied from the purge gas source 3. In preparation for step S103 described below, the control device 60 causes the first valve 21 to close, and causes the third valve 23 and the second valve 22 to open.

The filling of the buffer tank 30 with the purge gas may be performed simultaneously with step S101. When the buffer tank 30 is filled with the purge gas, the process by the control device 60 may proceed to step S103 without performing step S102.

Figure 5:
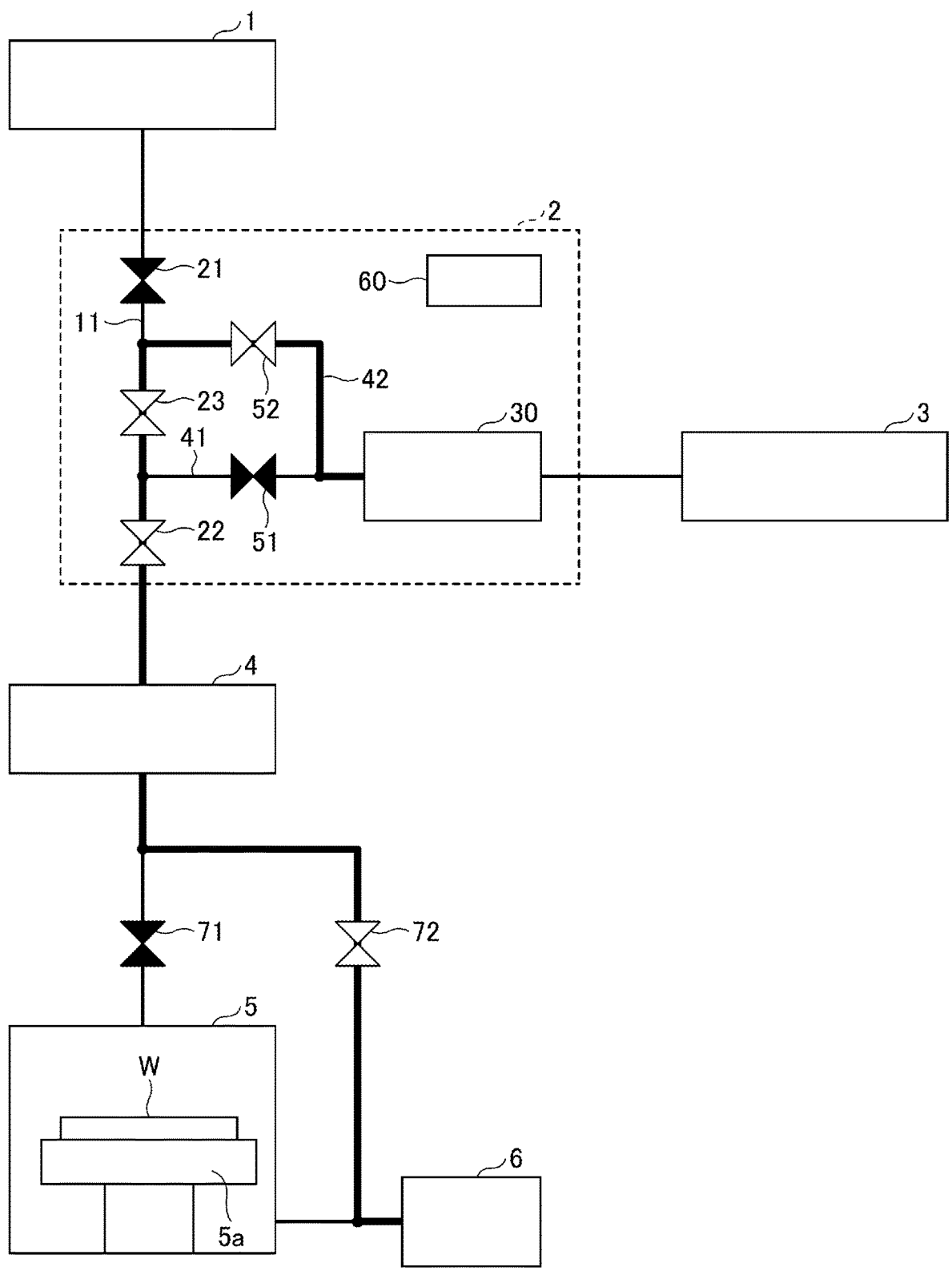
FIG. 5 is a diagram for describing the opening and closing of the valves and formation of the flow path in a case where the purge gas is supplied to a third valve.

In step S103, the control device 60 causes the purge gas to be supplied to the third valve 23. FIG. 5 is a diagram for describing the opening and closing of the valves and formation of the flow path, in a case where the purge gas is supplied to the third valve 23. The control device 60 causes the second purge gas valve 52 to open in a state (see FIG. 4) in which the first valve 21, the first purge gas valve 51, and the second purge gas valve 52 are closed and the third valve 23 and the second valve 22 are opened. With this arrangement, the second purge-gas supply line 42 becomes in communication with the powder transport line 11.

A high-pressure purge gas, with which the buffer tank 30 is filled, passes through the second purge-gas supply line 42, and finally is supplied to the third valve 23. The purge gas blows off the powder feedstock remaining on the valve disc, the valve seat, and the like of the third valve 23. Also, the purge gas is supplied from the third valve 23 to the second valve 22. The purge gas blows off the powder feedstock remaining on the valve disc, the valve seat, and the like of the second valve 22. The purge gas and the powder feedstock blown off by the purge gas flow into the vaporizer 4. The powder feedstock is collected by the filter (not illustrated) of the vaporizer 4. The purge gas passes through the valve 72 and is moved to the exhaust device 6. The first valve 21 is closed to prevent the purge gas from flowing into the powder feedstock source 1.

Figure 6:
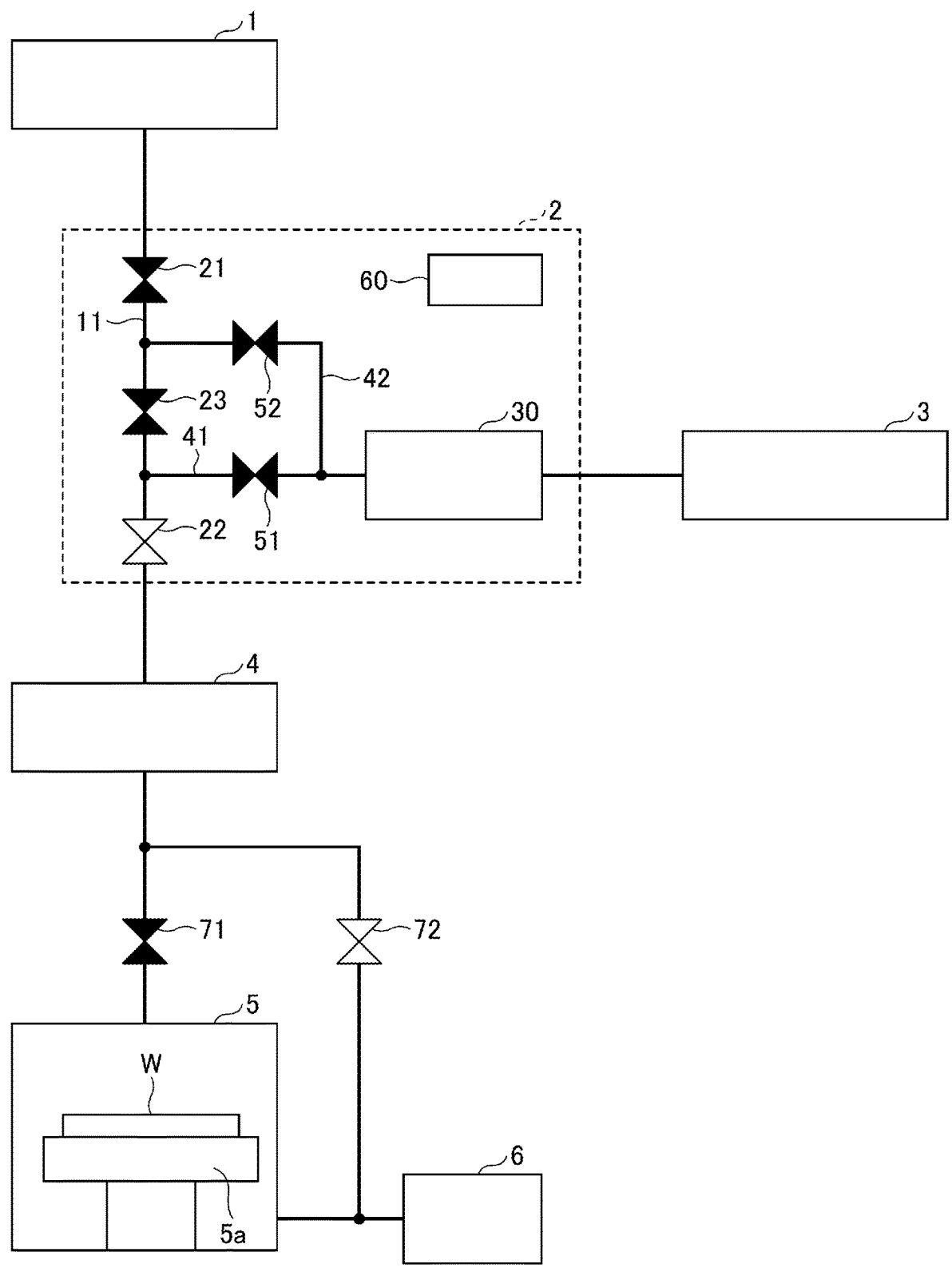
FIG. 6 is a diagram for describing the opening and closing of the valves and formation of the flow path during filling of the purge gas.

In step S104, the control device 60 causes the buffer tank 30 to be filled with the purge gas. FIG. 6 is a diagram for describing the opening and closing of the valves and formation of the flow path, during the filling of the purge gas. In this case, the buffer tank 30 is filled with the purge gas before a purge process illustrated in step S105 described below. The control device 60 causes the first purge gas valve 51 and the second purge gas valve 52 to close. With this arrangement, the first purge-gas supply line 41 and the second purge-gas supply line 42 are closed. Thus, the buffer tank 30 is filled with the purge gas that is supplied from the purge gas source 3. In preparation for step S105 described below, the control device 60 causes the first valve 21 and the third valve 23 to close, and causes the second valve 22 to open.

Figure 7:
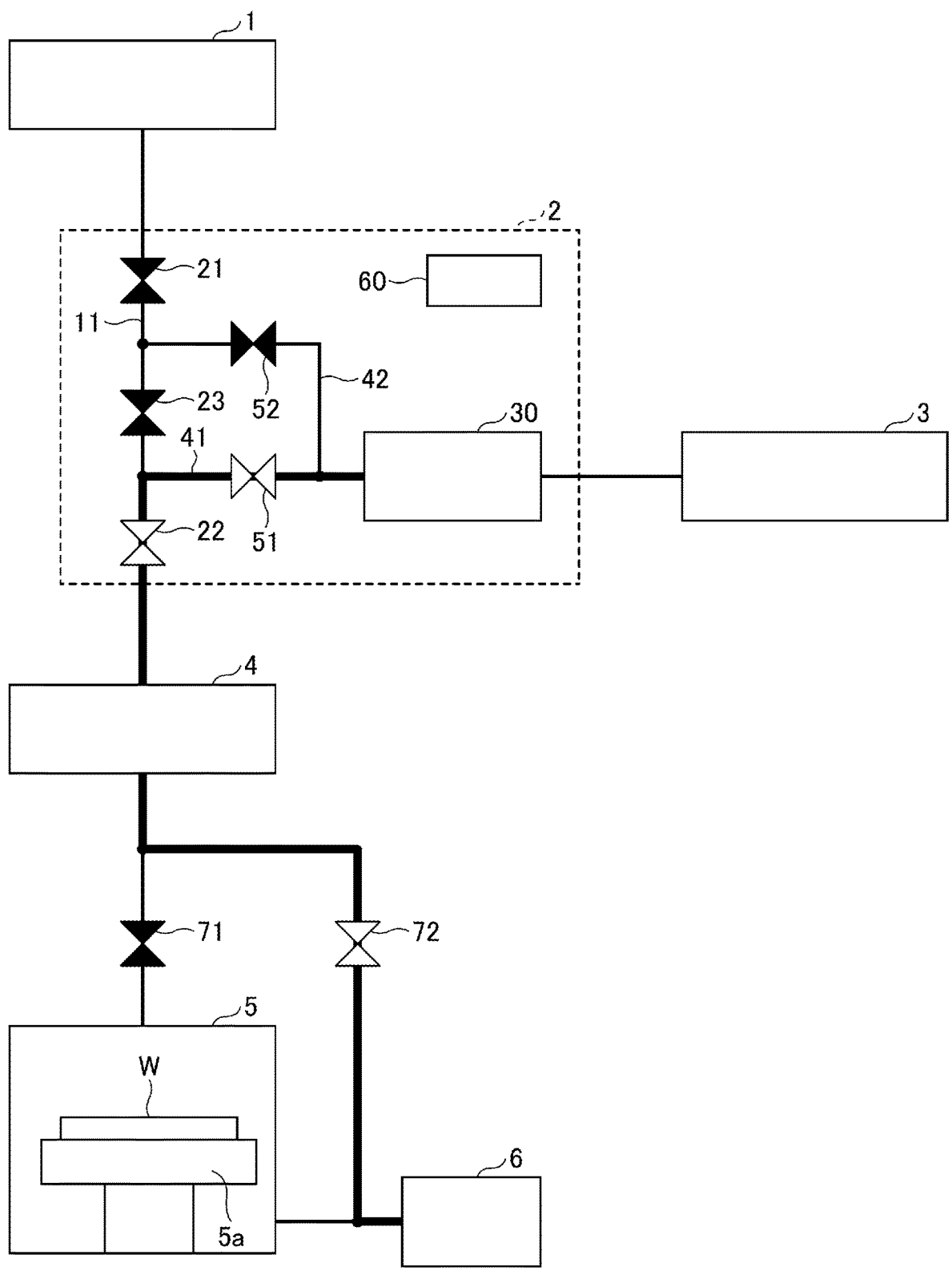
FIG. 7 is a diagram for describing the opening and closing of the valves and formation of the flow path in a case where the purge gas is supplied to a second valve.

In step S105, the control device 60 causes the purge gas to be supplied to the second valve 22. FIG. 7 is a diagram for describing the opening and closing of the valves and formation of the flow path, in a case where the purge gas is supplied to the second valve 22. The control device 60 causes the first purge gas valve 51 to open in a state (see FIG. 6) in which the first valve 21, the third valve 23, the first purge gas valve 51, and the second purge gas valve 52 are closed and the second valve 22 is opened. With this arrangement, the first purge-gas supply line 41 comes into communication with the powder transport line 11.

A high-pressure purge gas, with which the buffer tank 30 is filled, passes through the first purge-gas supply line 41, and finally is supplied to the second valve 22. The purge gas blows off the powder feedstock remaining on the valve disc, the valve seat, and the like of the second valve 22. The purge gas and the powder feedstock blown off by the purge gas flow into the vaporizer 4. The powder feedstock is collected by the filter (not illustrated) of the vaporizer 4. The purge gas passes through the valve 72, and then is moved to the exhaust device 6. The first valve 21, the third valve 23, and the second purge gas valve 52 are closed to prevent the purge gas from flowing into the powder feedstock source 1.

In step S106, the control device 60 determines whether the number of repetitions for the purging via the second valve 22 has reached a predetermined number. If the predetermined number of repetitions is not reached (NO in S106), the process by the control device 60 returns to step S104, and thus the filling (S104) of the buffer tank 30 with the purge gas and the purging (S105) via the second valve 22 are repeatedly performed. If the predetermined number of repetitions is reached (YES in S106), the control device 60 causes the valves 21 to 23 and the purge gas valves 51 and 52 to close, and then terminates the process.

With this arrangement, after the filling (S101) of the vaporizer 4 with the powder feedstock, the purging (S102 and S103) via the third valve 23 and the purging (S104 to S106) via the second valve 22 are performed. Further, before the powder feedstock with which the vaporizer 4 is filled is heated and vaporized, the interior of the vaporizer 4 is exhausted by the exhaust device 6, and thus becomes a high vacuum.

In the powder conveying apparatus 2 according to the first embodiment, the powder feedstock remaining in the second valve 22, which is closest to the vaporizer 4 and is among the valves (the first valve 21, the third valve 23, and the second valve 22) that are provided on the powder transport line 11, can be removed, where the the powder transport line 11 couples the powder feedstock source 1 and the vaporizer 4. With this arrangement, adhesion between the valve disc and the valve seat of the second valve 22 is increased, and thus occurrence of internal leakage can be prevented. Therefore, the interior of the vaporizer 4 can maintain a high vacuum.

In addition, by repeating the filling (S104) of the buffer tank 30 with the purge gas and the purging (S105) via the second valve 22, the powder feedstock remaining in the second valve 22 can be removed. The number of repetitions is preferably 3 or more. With this arrangement, the powder feedstock remaining in the second valve 22 can be removed.

In the powder conveying apparatus 2 according to the first embodiment, the powder feedstock remaining in the third valve 23 can be removed, and thus adhesion between the valve disc and the valve seat of the third valve 23 can be increased to prevent the occurrence of internal leakage. With this arrangement, the powder transport line 11 can be reliably closed by the second valve 22 and the third valve 23, and thus occurrence of internal leakage can be further prevented. Therefore, the interior of the vaporizer 4 can maintain a high vacuum.

The filling (S102) of the buffer tank 30 with the purge gas and the purging (S103) via the third valve 23 may be repeatedly performed. With this arrangement, the powder feedstock remaining in the third valve 23 can be removed. The number of repetitions is preferably 3 or more. With this arrangement, the powder feedstock remaining in the third valve 23 can be removed.

As an approach to determine whether the powder feedstock remaining in the second valve 22 and the third valve 23 has been removed, a hermeticity check (leak check) for the second valve 22 and the third valve 23 may be made. The hermeticity check for the second valve 22 and the third valve 23 is made after the purging (S105) via the second valve 22. As an approch to make the hermeticity check, the control device 60 first causes the first purge gas valve 51 to open in a state where the second valve 22 and the third valve 23 are closed. With this arrangement, the purge gas is supplied, via the first purge gas valve 51, from the buffer tank 30 to the powder transport line 11 that is between the second valve 22 and the third valve 23. Then, the control device 60 causes the first purge gas valve 51 to close. With this arrangement, the powder transport line 11 between the second valve 22 and the third valve 23 is filled with the purge gas. Subsequently, the control device 60 checks variations in pressure that is obtained by a pressure gauge (not illustrated), which is provided between the second valve 22 and the third valve 23 that are situated on the powder transport line 11. If pressure does not vary within a predetermined time period or variations in pressure are within a predetermined range, the control device 60 determines that the powder feedstock remaining in the second valve 22 and the third valve 23 has been removed, and then terminates a powder removal process.

The hermeticity check (leak check) may be made each time the purging via the second valve 22 and the third valve 23 is performed once. Alternatively, the hermeticity check (leak check) may be performed after the purging is performed a plurality of times (three times or more).

Second Embodiment

Figure 8:
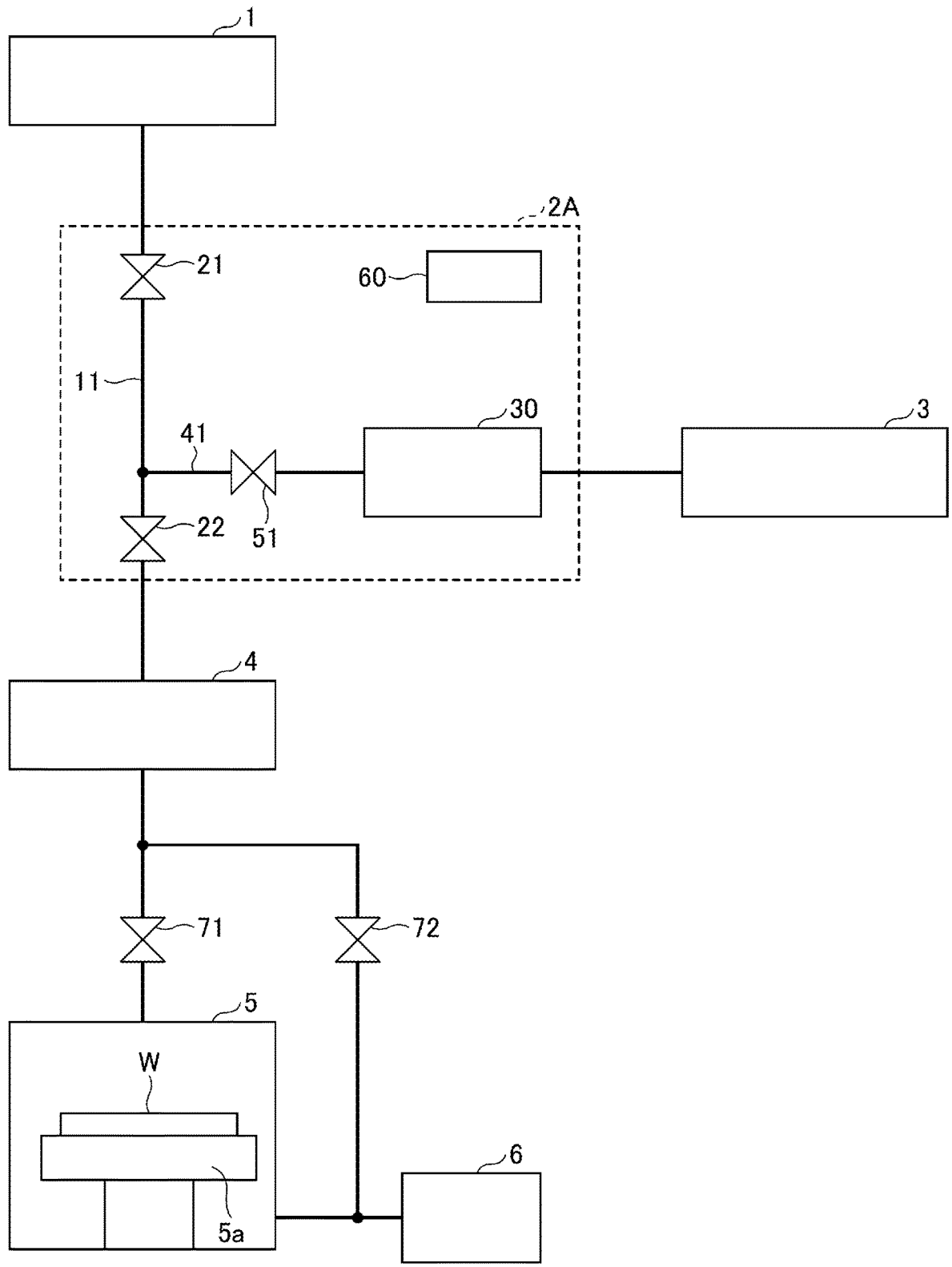
FIG. 8 is a diagram illustrating a configuration example of the substrate processing system with the powder conveying apparatus according to a second embodiment.

Hereinafter, the substrate processing system that with a powder conveying apparatus 2A according to a second embodiment will be described with reference to FIG. 8. FIG. 8 is a diagram illustrating a configuration example of the substrate processing system with the powder conveying apparatus 2 according to the second embodiment. The substrate processing system of the second embodiment (see FIG. 8) differs from the substrate processing system of the first embodiment (see FIG. 1) in that the powder conveying apparatus 2A is provided instead of the powder conveying apparatus 2.

The powder conveying apparatus 2A includes the powder transport line 11, the first valve 21, the second valve 22, the buffer tank 30, the first purge-gas supply line 41, the first purge gas valve 51, and the control device 60. That is, the powder conveying apparatus 2A differs from the powder conveying apparatus 2 (see FIG. 1) in that the third valve 23, the second purge-gas supply line 42, and the second purge gas valve 52 are omitted. Other configurations are the same as those of the powder conveying apparatus 2, and accordingly, the redundant description thereof is omitted.

Figure 9:
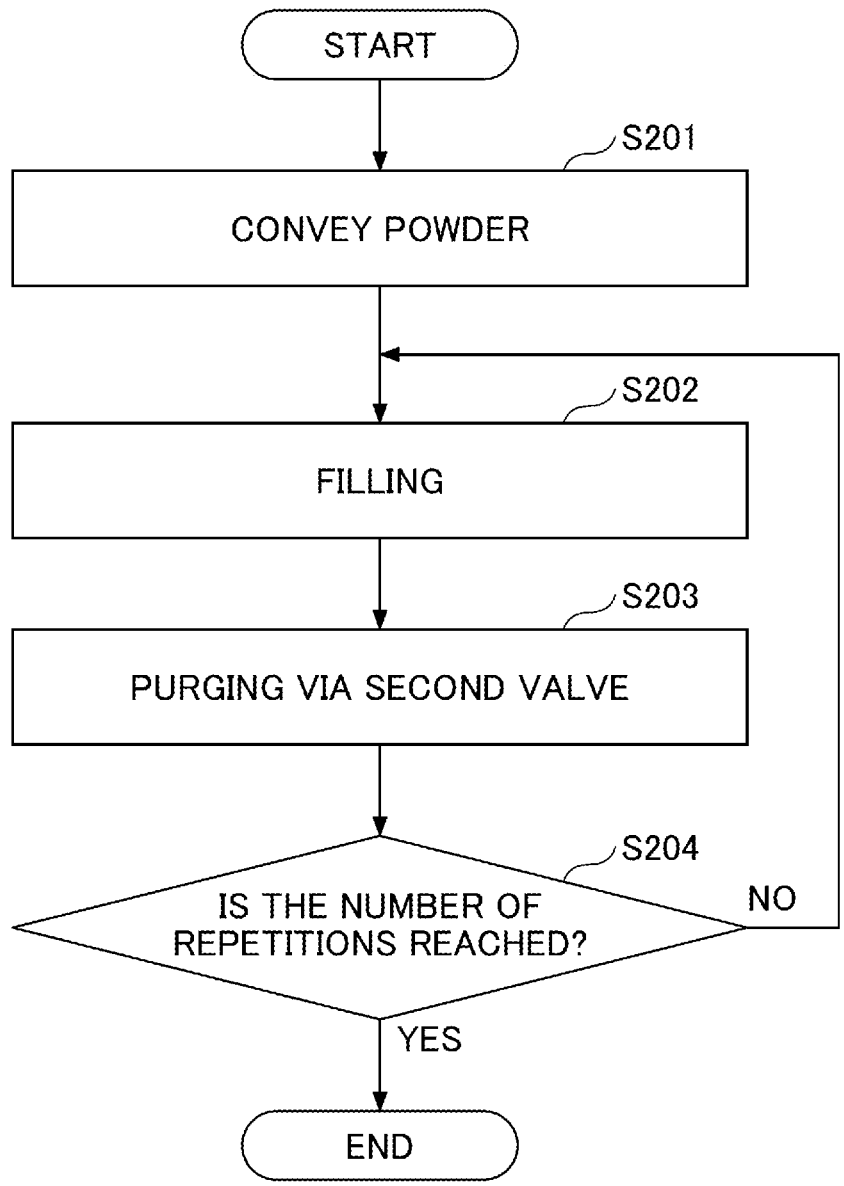
FIG. 9 is a flowchart illustrating an example of the operation of the powder conveying apparatus.
Figure 10:
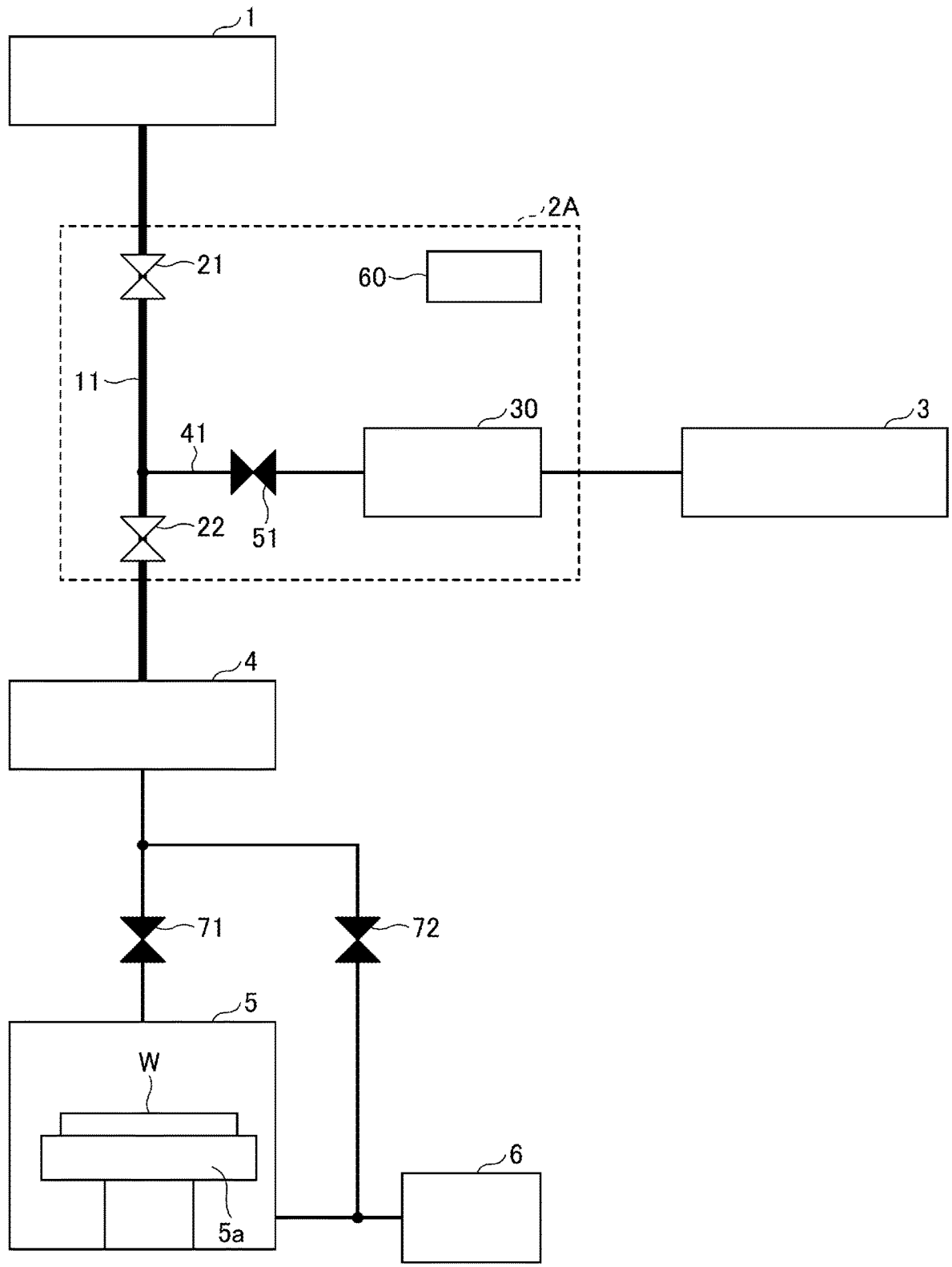
FIG. 10 is a diagram for describing the opening and closing of the valves and formation of the flow path during conveyance of the powder feedstock.
Figure 11:
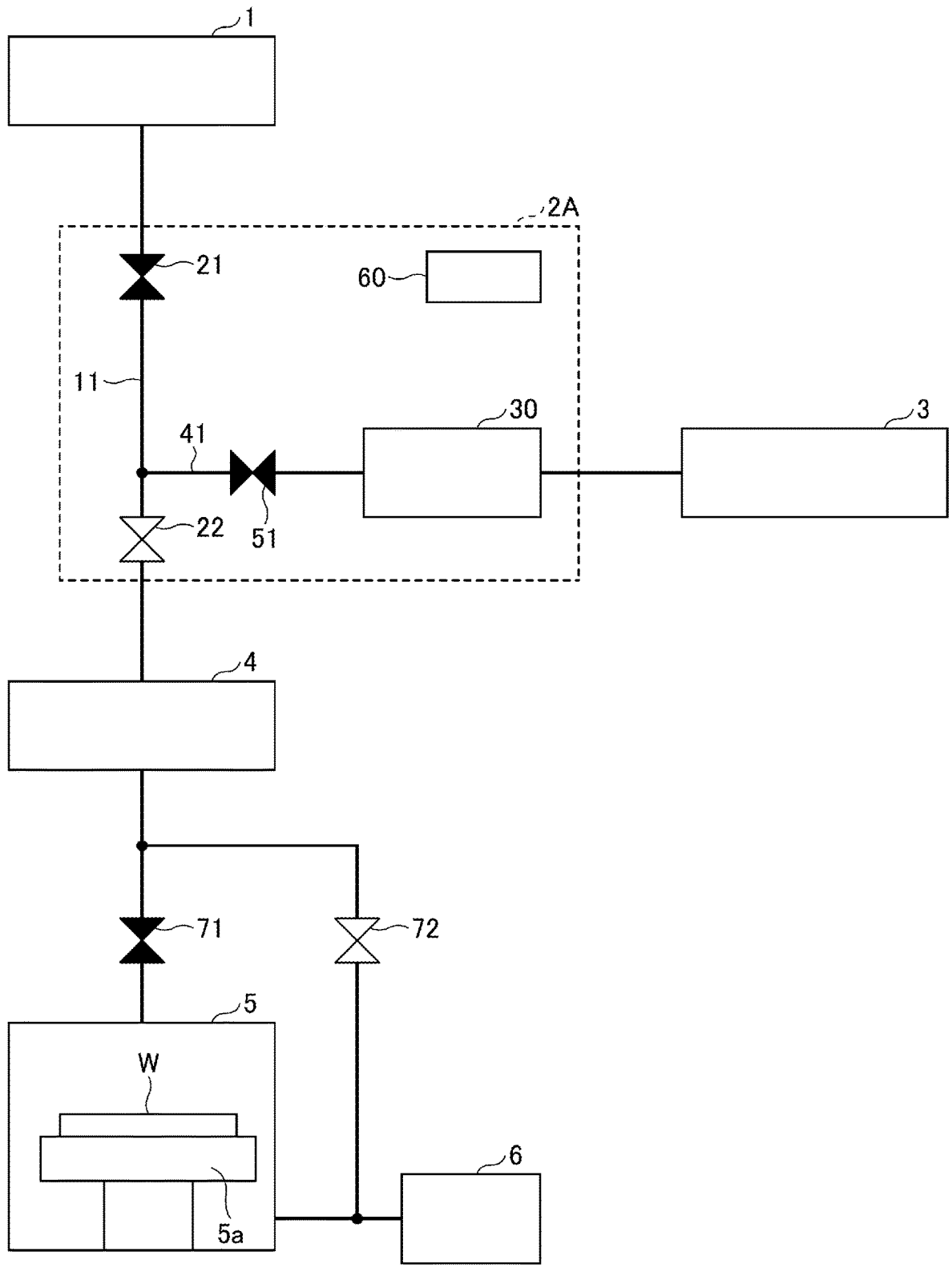
FIG. 11 is a diagram describing the opening and closing of the valves and formation of the flow path during filling of the purge gas.
Figure 12:
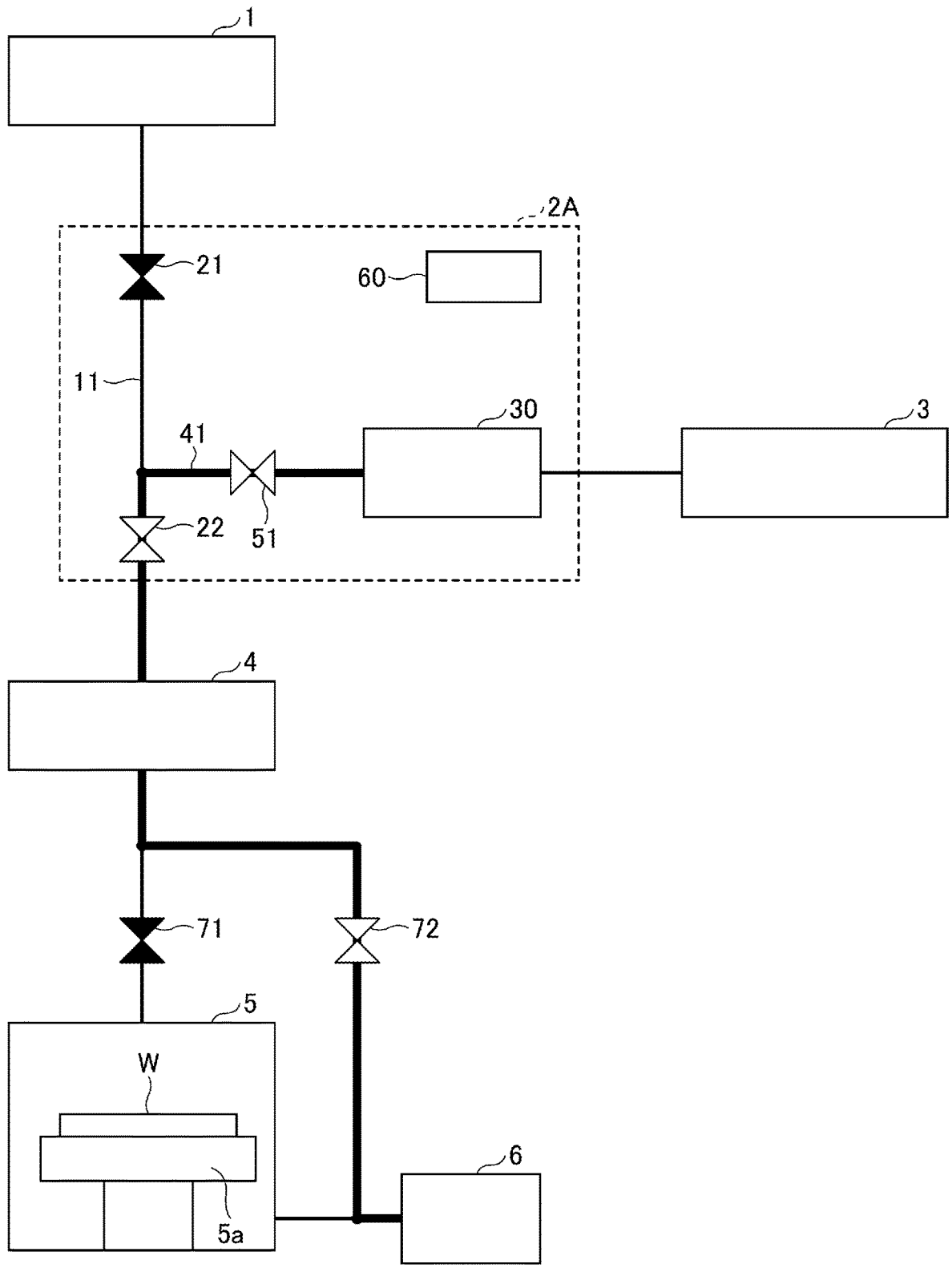
FIG. 12 is a diagram for describing the opening and closing of the valves and formation of the flow path in a case where the purge gas is supplied to the second valve.

An example of the operation of the powder conveying apparatus 2 will be described with reference to FIGS. 9 to 12. FIG. 9 is a flowchart illustrating an example of the operation of the powder conveying apparatus 2. FIGS. 10 to 12 are diagrams for describing the opening and closing of the valves 21 to 23, and 51 to 52 and formation of the flow path in corresponding steps.

In step S201, the control device 60 causes the powder feedstock to be conveyed from the powder feedstock source 1 to the vaporizer 4. FIG. 10 is a diagram for describing the opening and closing of the valves and formation of the flow path during conveyance of the powder feedstock. The control device 60 causes the first valve 21 and the second valve 22 to open. The control device 60 causes the first purge gas valve 51 to open. With this arrangement, the powder transport line 11 of the powder conveying apparatus 2 causes the powder feedstock source 1 and the vaporizer 4 to be in communication with each other. The first purge-gas supply line 41 is closed.

The powder feedstock fed from the powder feedstock source 1 passes through the powder transport line 11, and finally is conveyed to the vaporizer 4. At this time, a portion of the powder feedstock adheres to the inner wall surface of the powder transport line 11 and the surfaces and the like of valve discs and valve seats of the respective valves 21 and 22.

In step S202, the control device 60 causes the buffer tank 30 to be filled with the purge gas. FIG. 11 is a diagram for describing the opening and closing of the valves and formation of the flow path during filling of the purge gas. In this case, the buffer tank 30 is filled with the purge gas before a purge process illustrated in step S203 described below. The control device 60 causes the first purge gas valve 51 to close. With this arrangement, the first purge-gas supply line 41 is closed. Thus, the buffer tank 30 is filled with the purge gas that is supplied from the purge gas source 3. In preparation for step S203 described below, the control device 60 causes the first valve 21 to close, and causes the second valve 22 to open.

In step S203, the control device 60 causes the purge gas to be supplied to the second valve 22. FIG. 12 is a diagram for describing the opening and closing of the valves and formation of the flow path, in a case where the purge gas is supplied to the second valve 22. The control device 60 causes the first purge gas valve 51 to open in a state (see FIG. 11) in which the first valve 21 and the first purge gas valve 51 are closed and the second valve 22 is opened. With this arrangement, the first purge-gas supply line 41 becomes in communication with the powder transport line 11.

The high-pressure purge gas, with which the buffer tank 30 is filled, passes throguh the first purge-gas supply line 41, and finally is supplied to the second valve 22. The purge gas blows off the powder feedstock remaining on the valve disc and valve seat and the like of the second valve 22. The purge gas and the powder feedstock blown off by the purge gas flow into the vaporizer 4. The powder feedstock is collected by the filter (not illustrated) of the vaporizer 4. The purge gas passes through the valve 72, and then is moved to the exhaust device 6. The first valve 21 is closed to prevent the purge gas from flowing into the powder feedstock source 1.

In step S204, the control device 60 determines whether the number of repetitions for the purging via the second valve 22 has reached a predetermined number. If the predetermined number of repetitions is not reached (NO in S204), the process by the control device 60 returns to step S202, and the filling (S202) of the buffer tank 30 with the purge gas and the purging (S203) via the second valve 22 (S203) are repeatedly performed. If the predetermined number of repetitions is reached (YES in S204), the control device 60 causes the valves 21 and 22 and the purge gas valve 51 to close, and then terminates the process.

With this arrangement, after the filling (S202) of the vaporizer 4 with the powder feedstock, the purging (S202 to S204) via the second valve 22 is performed. Further, before the powder feedstock with which the vaporizer 4 is filled is heated and vaporized, the interior of the vaporizer 4 is exhausted by the exhaust device 6 to become a high vacuum.

In the powder conveying apparatus 2 according to the second embodiment, the powder feedstock remaining in the second valve 22, which is closest to the vaporizer 4 and is among the valves (the first valve 21 and the second valve 22) that are provided on the powder transport line 11, can be removed, where the powder transport line 11 couples the powder feedstock source 1 and the vaporizer 4. With this arrangement, adhesion between the valve disc and the valve seat of the second valve 22 is increased, and thus occurrence of interior leak can be prevented. Therefore, the interior of the vaporizer 4 can retain a high vacuum.

Although the powder conveying apparatuses according to the first and second embodiments are described above, the present disclosure is not limited to the above embodiments and the like, and various modifications and improvements can be made within the scope of the sprit of the present disclosure set forth in the claims.

This application claims priority to Japanese Patent Application No. 2020-163475, filed on Sep. 29, 2020, the entire contents of which are incorporated herein by reference.

REFERENCE SIGNS LIST 1 powder feedstock source
2 powder conveying apparatus
3 purge gas supply
4 vaporizer
5 processing chamber
6 exhaust device
11 powder transport line
21 first valve
22 second valve
23 third valve
30 buffer tank
41 first purge-gas supply line
42 second purge-gas supply line
51 first purge gas valve
52 second purge gas valve
60 control device (controller)

The invention claimed is:

1. A powder conveying apparatus for conveying powder from a powder feedstock source to a vaporizer, the powder conveying apparatus comprising:
   a powder transport line configured to connect the powder feedstock source to the vaporizer and configured to supply the powder from the powder feedstock source to the vaporizer;
   a first purge-gas supply line via which a buffer tank is coupled to the powder transport line at a first branch point, the first purge-gas supply line enabling a purge gas to be supplied from the buffer tank to the powder transport line;
   a first valve provided on a powder feedstock source-side of the powder transport line with respect to the first branch point;
   a second valve provided on a vaporizer-side of the powder transport line with respect to the first branch point;
   a first purge gas valve provided on the first purge-gas supply line; and
   a controller configured to
      a) control opening and closing of the first valve, the second valve, and the first purge gas valve,
      b) supply the powder from the powder feedstock source to the vaporizer through the powder transport line and via the first valve and the second valve,
      c) after b), close the first valve and open the second valve such that the purge gas from the buffer tank is delivered to the vaporizer via the second valve, and the second valve is purged as a result of delivering the purge gas to the vaporizer, and
      d) repeat b) and c) a set number of times.

2. The powder conveying apparatus according to claim 1, wherein the controller is configured to:
   open the first valve and the second valve, and close the first purge gas valve to convey a powder feedstock from the powder feedstock source to the vaporizer, and
   close the first purge gas valve to fill the buffer tank with the purge gas, and
   close the first valve, and open the second valve and the first purge gas valve to supply the purge gas to the second valve.

3. The powder conveying apparatus according to claim 2, wherein the controller is configured to repeatedly fill the buffer tank with the purge gas, and supply the purge gas to the second valve.

4. The powder conveying apparatus according to claim 3, wherein the controller is configured to repeatedly fill the buffer tank with the purge gas, and supply the purge gas to the second valve, three times or more.

5. The powder conveying apparatus according to claim 3, wherein the controller is configured to execute a hermeticity check for the second valve after the purge gas is supplied to the second valve.

6. The powder conveying apparatus according to claim 1, further comprising:
   a third valve provided on the powder transport line between the first valve and the second valve, the controller being configured to control opening and closing of the third valve;
   a second purge-gas supply line via which the buffer tank is coupled to the powder transport line at a second branch point, the second branch point being situated between the first valve and the third valve, and the second purge-gas supply line being configured to supply the purge gas to from the buffer tank to the powder transport line; and
   a second purge gas valve provided on the second purge-gas supply line, the controller being configured to control opening and closing of the second purge gas valve.

7. The powder conveying apparatus according to claim 6, wherein the controller is configured to cause:
   open the first valve, the second valve, and the third valve, and close the first purge gas valve and the second purge gas valve to convey the powder feedstock from the powder feedstock source to the vaporizer;
   close the first purge gas valve and the second purge gas valve to fill the buffer tank with the purge gas;
   close the first valve and the first purge gas valve, and open the second valve, and the third valve, and the second purge gas valve to supply the purge gas to the third valve;
   close the first purge gas valve and the second purge gas valve to fill the buffer tank with the purge gas; and
   close the first valve, the third valve, and the second purge gas valve, and open the second valve and the first purge gas valve to supply the purge gas to the second valve.

8. The powder conveying apparatus according to claim 7, wherein the controller is configured to repeatedly fill the buffer tank with the purge gas, and supply the purge gas to the third valve, three times or more.

9. The powder conveying apparatus according to claim 7, wherein the controller is configured to repeatedly fill the buffer tank with the purge gas, and supply the purge gas to the second valve, three times or more.

10. The powder conveying apparatus according to claim 7, wherein the controller is configured to execute a hermeticity check for the second valve after the purge gas is supplied to the second valve.

11. A gas supply apparatus comprising:
   the powder conveying apparatus according to claim 1;
   the powder feedstock source configured to deliver the powder to the vaporizer under gravity feed; and
   the vaporizer configured to vaporize the powder delivered from the powder feedstock source via the power conveying apparatus.

* * * * *